(12) United States Patent
Tyhach et al.

(10) Patent No.: US 7,309,906 B1
(45) Date of Patent: Dec. 18, 2007

(54) APPARATUS AND METHODS FOR PROVIDING HIGHLY EFFECTIVE AND AREA EFFICIENT DECOUPLING CAPACITANCE IN PROGRAMMABLE LOGIC DEVICES

(75) Inventors: Jeffrey Tyhach, Sunnyvale, CA (US); Bonnie I Wang, Cupertino, CA (US); Yan Chong, San Jose, CA (US); Chiakang Sung, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 257 days.

(21) Appl. No.: 11/097,503

(22) Filed: Apr. 1, 2005

Related U.S. Application Data

(60) Provisional application No. 60/558,913, filed on Apr. 1, 2004.

(51) Int. Cl.
*H01L 29/00* (2006.01)
*H01L 21/8242* (2006.01)

(52) U.S. Cl. .............. 257/532; 257/534; 257/E27.048; 257/E21.008; 438/239; 438/394

(58) Field of Classification Search ................ 257/229, 257/296, 532; 438/128, 131, 132, 239
See application file for complete search history.

(56) References Cited

U.S. PATENT DOCUMENTS

| | | | | |
|---|---|---|---|---|
| 4,948,756 A | * | 8/1990 | Ueda | 438/622 |
| 5,863,833 A | * | 1/1999 | Shin | 438/624 |
| 5,998,846 A | * | 12/1999 | Jan et al. | 257/401 |
| 6,385,033 B1 | * | 5/2002 | Javanifard et al. | 361/306.2 |
| 6,693,315 B2 | * | 2/2004 | Kuroda et al. | 257/288 |
| 6,829,127 B1 | * | 12/2004 | Liu et al. | 361/100 |
| 7,002,872 B2 | * | 2/2006 | Hwang et al. | 365/230.03 |
| 7,098,523 B2 | * | 8/2006 | Chen et al. | 257/533 |
| 2003/0221313 A1 | * | 12/2003 | Gann | 29/840 |

* cited by examiner

*Primary Examiner*—T. N. Quach
(74) *Attorney, Agent, or Firm*—Ropes & Gray, LLP; Michael J. Chasen

(57) ABSTRACT

Improved decoupling capacitor designs and layout schemes are provided that generate high effective capacitance and high area efficiency at higher frequencies than that of previously known decoupling capacitor designs. The improved decoupling capacitor designs utilize transistor gates with shorter channel lengths to reduce the total parasitic resistance of the channel, thereby providing higher effective capacitance at higher frequencies. To enable higher area efficiency of this decoupling capacitor design, excess contacts are replaced with polysilicon in a grid or waffle pattern.

15 Claims, 5 Drawing Sheets

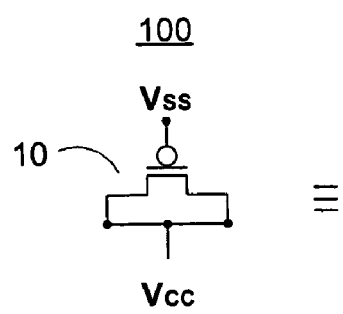
FIG. 1A  FIG. 1B  FIG. 1C

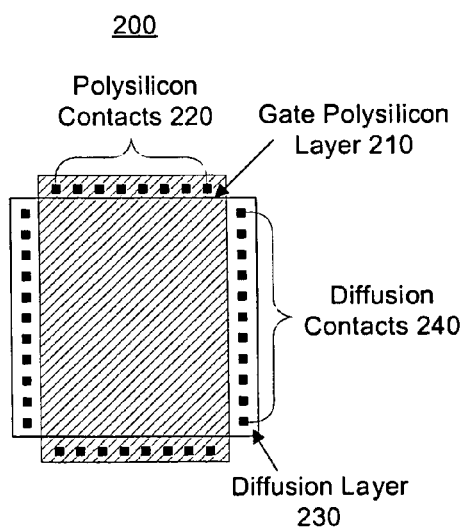
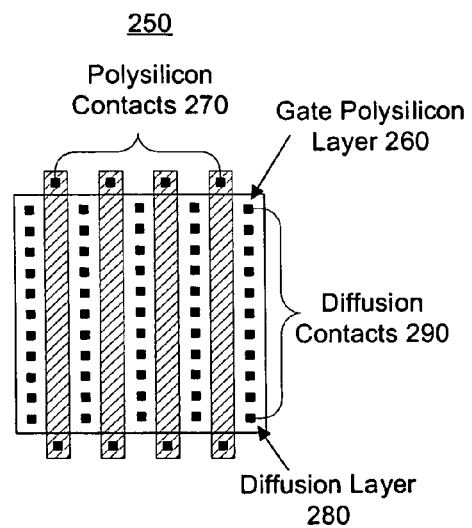
FIG. 2A  FIG. 2B

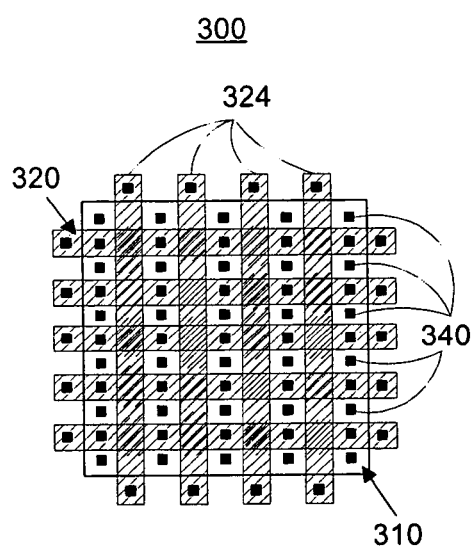
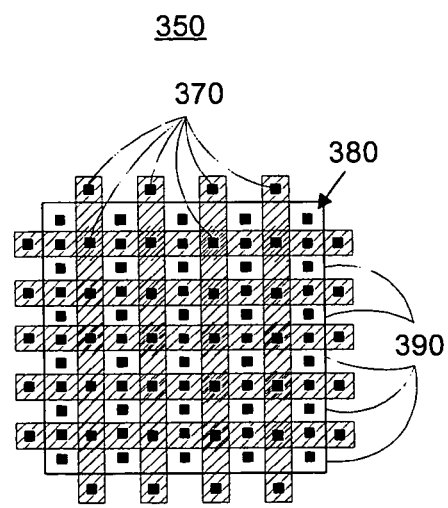
FIG. 3A  FIG. 3B

APPARATUS AND METHODS FOR PROVIDING HIGHLY EFFECTIVE AND AREA EFFICIENT DECOUPLING CAPACITANCE IN PROGRAMMABLE LOGIC DEVICES

This application claims the benefit of U.S. provisional patent application No. 60/558,913, filed Apr. 1, 2004, which is hereby incorporated by reference herein in its entirety.

BACKGROUND OF THE INVENTION

The present invention relates generally to decoupling capacitors on programmable logic devices (PLDs), and more specifically to such decoupling capacitors for generating high effective capacitance at high noise frequencies and with high area efficiency.

It should be noted that the term PLD as used herein is intended to cover the broad space of programmable logic. This includes devices formed in a silicon semiconducting substrate commonly known as CPLDs (Complex Programmable Logic Devices) such as MAX® 7000® from Altera Corporation of San Jose, Calif., FPGAs (Field Programmable Gate Arrays) such as Stratix® from Altera, or Structured ASICs (metal programmable logic) such as HardCopy® from Altera.

As PLDs become more integrated into high-speed systems, high performance with excellent signal integrity becomes more important. Previously known high-speed system designs have utilized on-chip decoupling capacitors implemented through the use of standard, direct transistor gate capacitance. This known approach is implemented by using the gate capacitance of a transistor with an arbitrary width (W) and length (L) combination. Nevertheless, this is also not sufficient, because the parasitic resistances of the gate and the device channel limit the capacitor's frequency response and, therefore, cannot create a large amount of capacitance at high frequencies. Unfortunately, such high frequencies are inherent in power supply noise, which is exactly the application these capacitors are targeted to dampen.

Accordingly, it would be desirable to provide improved decoupling capacitor designs for generating high effective capacitance at high noise frequencies and with high area efficiency.

SUMMARY OF THE INVENTION

In accordance with the present invention, improved decoupling capacitor designs for generating high effective capacitance at high noise frequencies and with high area efficiency are provided.

The present invention achieves high capacitance at high noise frequencies by increasing the number of transistors used in the decoupling capacitor design while reducing the channel length of each of the transistors, thereby reducing their channel resistance. The number of diffusion and polysilicon layer contacts in the structure is reduced to achieve higher area efficiency on the device.

In accordance with one embodiment of the present invention, a programmable logic device is provided. The programmable logic device is preferably formed on a silicon semiconductor substrate. The programmable logic device includes a decoupling capacitor. The capacitor comprising a diffusion layer diffused into the silicon semiconductor substrate, the diffusion layer comprising electrical contacts, a polysilicon layer formed over at least a portion of the diffusion layer, the polysilicon layer comprising holes and electrical contacts, and wherein at least a portion of the contacts associated with the diffusion layer are formed under the holes such that an electrical conductor can pass through the holes to contact the contacts associated with the diffusion layer.

BRIEF DESCRIPTION OF THE DRAWINGS

The above and other advantages of the present invention will be more apparent upon consideration of the following detailed description, taken in conjunction with the accompanying drawings, in which like reference characters refer to like parts throughout, and in which:

FIG. 1A is a simplified schematic of a decoupling capacitor utilizing a transistor in accordance with the present invention;

FIGS. 1B and 1C are circuit diagrams modeling the capacitance of the transistor of FIG. 1A as a simple RC network and as a single capacitor, respectively, to determine the effective capacitance of the decoupling capacitor of FIG. 1A in accordance with the present invention;

FIG. 2A shows a layout scheme of traditional on-chip decoupling capacitors;

FIG. 2B shows a preferred embodiment of a layout scheme of on-chip decoupling capacitors designed for high capacitance at high frequencies in accordance with the present invention;

FIG. 3A shows a preferred embodiment of a layout scheme of on-chip decoupling capacitors designed for high capacitance at high frequencies and with high area efficiency in accordance with the present invention;

FIG. 3B shows an other preferred embodiment of a layout scheme of on-chip decoupling capacitors designed for high capacitance at high frequencies and with high area efficiency in accordance with the present invention;

DETAILED DESCRIPTION OF THE PREFERRED EMBODIMENTS

Figure 4:
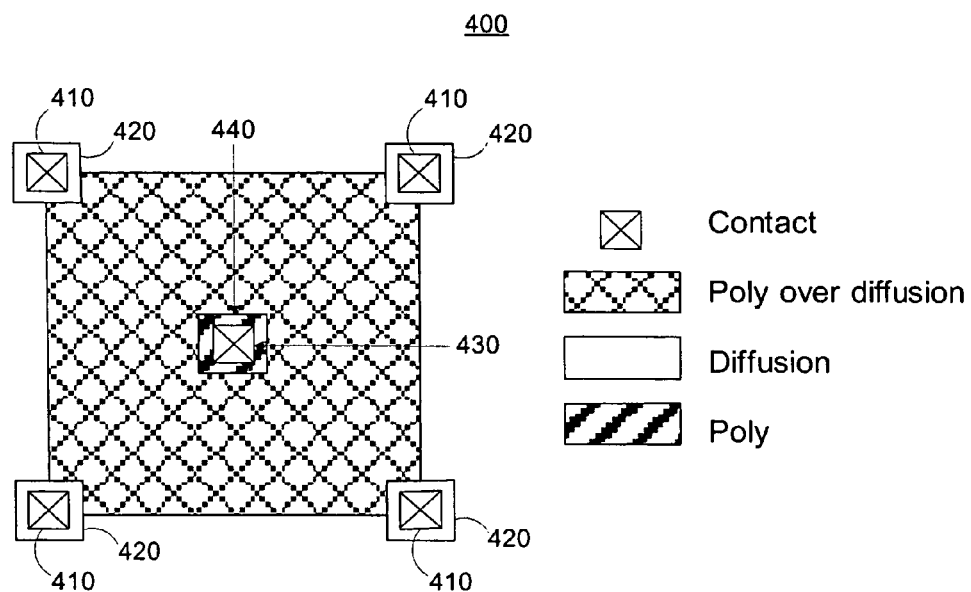
FIG. 4 is a close-up view of a portion of the layout scheme of FIG. 3B in accordance with the present invention.

Prior on-chip decoupling capacitor designs utilize transistor gates for capacitance, as generally shown, for example, by decoupling capacitor 100 of FIG. 1A, which includes transistor 10. This type of decoupling capacitor design presents the capacitance seen from the gate, to the channel of transistor 10, to the supply rails $V_{SS}$ and $V_{CC}$ to which transistor 10 is coupled. Prior, commonly known on-chip decoupling capacitor designs are implemented by using the gate capacitance of a transistor (e.g., transistor 10) with an arbitrarily large width (W) and length (L) combination.

While prior decoupling capacitor designs can create a large amount of capacitance, it is only effective at low frequencies, due to the significant resistances presented by the channel of the transistor (e.g., transistor 10). This frequency-dependant capacitance of transistor 10 of capacitor 100 can be modeled as a simple RC network 100', as shown in FIG. 1B, wherein $R_{gate}$ 20 models the resistance of the gate of transistor 10, $C_{gate}$ 30 models the capacitance seen at the gate of transistor 10, and $R_{on}$ 40 models the channel resistance of transistor 10 in the triode region. To understand the frequency response of decoupling capacitor 100, the intermediate model of FIG. 1B can be further simplified to a single capacitor 100'', as shown in FIG. 1C, wherein $C_{eff}$ 50 models the effective capacitance of decoupling capacitor 100. This effective capacitance $C_{eff}$ 50 of the design of decoupling capacitor 100 may be found for a specific target frequency f, based on the following equation 1:

$$C_{eff} \approx Z_{eff} = \frac{1}{2\pi f \left(R_{on} + R_{gate} + \frac{1}{2\pi f C_{gate}}\right)} \quad (1)$$

As can be seen by equation 1, at low frequencies f, gate capacitance $C_{gate}$ 30 dominates the value of effective capacitance $C_{eff}$ 50. As a result, a large capacitance can be generated regardless of the parasitic resistances. Hence, any arbitrary layout is sufficient at low frequencies f. However, as frequencies f increase, the resistive terms $R_{gate}$ 20 and $R_{on}$ 40 dominate equation 1 for $C_{eff}$ 50. Between $R_{on}$ 40 and $R_{gate}$ 20, the channel resistance term $R_{on}$ 40 dominates, and the value of gate capacitance $C_{gate}$ 30 is significantly reduced at high frequencies f.

Unfortunately, such high frequencies f are inherent in power supply noise, which is the primary application these decoupling capacitors are targeted for. To be effective, the performance of these capacitors must be improved at high frequencies. Therefore, in accordance with a preferred embodiment of the present invention, decoupling capacitor 100 may preferably be designed with a target frequency or frequency range, based on the frequency content of the generated noise to be dampened. Accordingly, for a specific target frequency or frequency range, the parasitic resistances $R_{gate}$ 20 and $R_{on}$ 40 of the gate and the device channel may preferably be balanced with the generated $C_{gate}$ 30, along with the area consumed, in order to generate the most area efficient and effective solution.

In accordance with a preferred embodiment of the present invention, transistors 10 with shorter channel lengths L are used to provide a decoupling capacitor 100 capable of providing high effective capacitance at high noise frequencies. Using a shorter channel length L significantly reduces the magnitude of the channel resistance term $R_{on}$ 40 (see, e.g., equation 1 and FIG. 1B). While this reduction of $R_{on}$ 40 does slightly increase the resistance $R_{gate}$ 20 of the gate of transistor 10, the net effect is a significantly reduced total parasitic resistance. As shown by equation 1, this total resistance limits the effective capacitance $C_{eff}$ 50 at higher frequencies f, allowing the capacitance $C_{gate}$ 30 seen at the gate of transistor 10 to have more influence. Overall, this optimization allows for increased capacitance of the decoupling capacitor 100 at higher frequencies and, hence, better noise suppression on the supply rails.

Therefore, while traditional on-chip decoupling capacitors use transistors with large widths W and large lengths L, as described above, high-frequency decoupling capacitors of the present invention utilize transistors with a much smaller L. Since these transistors have significantly smaller gate areas, additional transistors are required to obtain the same amount of capacitance.

The differences in the layout schemes of traditional on-chip decoupling capacitors and high-frequency optimized decoupling capacitors utilizing transistors with shorter lengths L can be seen in differentiating between FIGS. 2A and 2B, wherein each depicts the polysilicon layer of the gate electrode, the diffusion layer, and the contacts of each layer. FIG. 2A shows the layout scheme 200 of traditional on-chip decoupling capacitors with polysilicon gate electrode layer 210, polysilicon contacts 220, diffusion layer 230, and diffusion layer contacts 240, while FIG. 2B shows a preferred embodiment of a layout scheme 250 of on-chip decoupling capacitors with polysilicon gate electrode layer 260, polysilicon contacts 270, diffusion layer 280, and diffusion layer contacts 290, designed for high capacitance at high frequencies utilizing transistors with shorter lengths L in accordance with the present invention.

However, an issue with the transistors having shorter channel lengths L is that the area of the polysilicon layer forming its gate electrodes has decreased, but the overall area consumed by the contacts of both the polysilicon and diffusion layers has not decreased (as shown in FIG. 2B). As a result, the area overhead for terminal connections has increased as a percentage of the decoupling capacitor area. To resolve this issue, a new polysilicon structure has been devised in accordance with some embodiments of the present invention. Instead of using a simple transistor layout design to implement the gate capacitance (e.g., as shown in FIG. 2B), a grid or "waffle capacitor layout" scheme is used to implement the gate capacitance, wherein the polysilicon layer is formed from interlocking fingers. These fingers, which are selectively merged, effectively reduces the number of diffusion contacts by replacing the area of selected diffusion contacts (as shown in FIG. 2B) with polysilicon. This is illustrated in FIGS. 3A and 3B, for example.

In the waffle decoupling capacitor layout schemes of FIGS. 3A and 3B, the gate polysilicon layer exists as a solid layer, with a plurality of holes (also referred to herein as apertures) created for diffusion contacts, in accordance with the present invention. This layer of polysilicon may preferably exist on top of at least a portion of a layer of active diffusion. The polysilicon contacts may be added in one of the two typical manners illustrated in FIGS. 3A and 3B, or, alternatively, in any solution wherein the number of holes in the polysilicon is a variable (which will lead to the number of diffusion contacts being variable as well) and the number polysilicon contacts is a variable. These variables depend on the parasitic resistances, gate capacitance, and target maximum damping frequency of the device. Furthermore, an alternative solution for placing the contacts according to the invention may be non-symmetric.

In one embodiment of the present invention, as shown in FIG. 3A by decoupling capacitor layout scheme 300, which includes diffusion layer 310 and polysilicon layer 320, and polysilicon contacts 324 that are placed outside and along the sides of the active diffusion layer 310. Diffusion contacts 340 are distributed throughout the diffusion layer 310 by punching "holes" through the polysilicon layer 320 (or, alternatively, by forming the polysilicon in criss-crossing strips over the diffusion layer), insulating around the holes using an insulation layer (not shown), and forming contacts 340 to the diffusion layer 310 through the holes. This greatly simplifies the layout, especially for process technologies that forbid active diffusion beneath polysilicon contacts. Layout scheme 300 of FIG. 3A is also ideal for situations where $R_{gate}$ 20 does not dominate the effective capacitance $C_{eff}$ 50 of equation 1. One such situation occurs with CMOS processing using silicided polysilicon.

In another embodiment of the present invention, as shown in FIG. 3B by decoupling capacitor layout scheme 350, polysilicon contacts 370 are not only placed outside the active diffusion layer 380 but are also distributed throughout diffusion layer 380 to reduce the polysilicon resistance $R_{gate}$ 20 term (see, e.g., equation 1 and FIG. 1B). Because this layout increases the proximity between polysilicon contacts 390 and diffusion contacts 370, this is an ideal layout for frequencies where $R_{gate}$ 20 does dominate the effective capacitance $C_{eff}$ 50 of equation 1. One such situation occurs with CMOS processing using unsilicided polysilicon.

While FIGS. 3A and 3B represent two possible implementations, any spacing, density, pattern, or other combination of contacts, both of the polysilicon and diffusion layers, may be used in accordance with the present invention. The optimal solution will depend on the required application, target frequency, and other design considerations, for example. Also, it should be noted that any number of diffusion contacts can be used within each contact "hole" in the polysilicon layer, however a smaller number of diffusion contacts per hole leads to a more area efficient solution. Compared to the traditional decoupling capacitor design described above, the fingers of the polysilicon layers have been merged to limit the total number of contacts used on either layer. Substrate and/or well contacts (not shown) should also be placed within a reasonable distance from the capacitors.

The waffle decoupling capacitor layout schemes of the present invention exhibit higher effective capacitance at higher frequencies compared to traditional gate capacitance designs. In addition, these schemes are also more area efficient, as fewer polysilicon and diffusion layer contacts are required to implement the same amount of capacitance, hence requiring less die area. These schemes use less die area because they provide more capacitance per μm2 of the chip. These schemes also provide for better noise damping at higher frequencies than previously known decoupling capacitor designs.

For the various high-speed applications targeted by PLDs, from 1 Gbps low voltage differential signaling (LVDS) to 300 MHz memory interfaces, the noise generated is typically all high-frequency in nature, requiring fast response and area efficient capacitors. As a result, any decoupling capacitor design and waffle layout scheme of the present invention can be utilized across all of these PLD applications. As a result, waffle decoupling capacitance is a unique and appropriate solution for PLDs.

Since waffle decoupling capacitor layout schemes present greater effective capacitance in less area, better power supply noise suppression can be achieved, improving simultaneously switching output(SSO)—i.e., when multiple outputs are switching—and enhancing input and output buffer (I/O) performance. In addition to the I/O, these schemes can also be implemented in the core of the device, reducing supply variation and ground bounce, and allowing for higher chip $F_{max}$. The waffle decoupling capacitor schemes of the present invention are ideal for any application requiring capacitance for high-frequency signals and die area efficiency. Also, since these waffle capacitors are more area efficient, the same amount of capacitance can be implemented in a smaller area, thereby saving die size, reducing chip cost, and reducing total cost to the customer.

FIG. 4 shows a blown-up top view of an exemplary capacitor layout scheme 400 similar to a portion of the capacitor layout scheme 350 from FIG. 3. FIG. 4 shows a group of four contacts 410 that contact diffusion layer 420. FIG. 4 also shows one contact 430 that contacts polysilicon layer 440.

Figure 5:
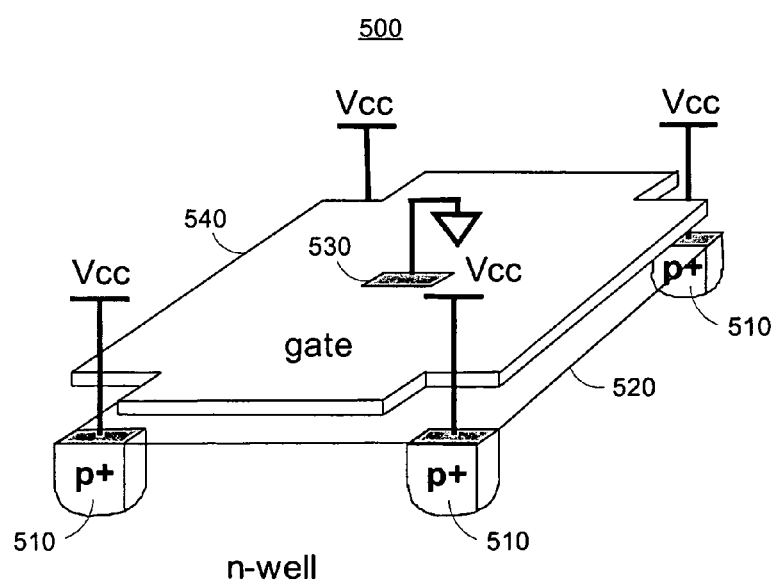
FIG. 5 is a perspective view of the portion of the layout scheme shown in FIG. 4.

FIG. 5 shows a perspective view 500 of the exemplary capacitor layout scheme 400 shown in FIG. 4. Contacts 510 are shown in diffusion layer 520. Contact 530 is shown in polysilicon layer 540. It should be noted that, although contacts 510 are shown as p+ contacts in an n-well, this is only one embodiment of the invention and does not limit the invention to this particular implementation.

Figure 6:
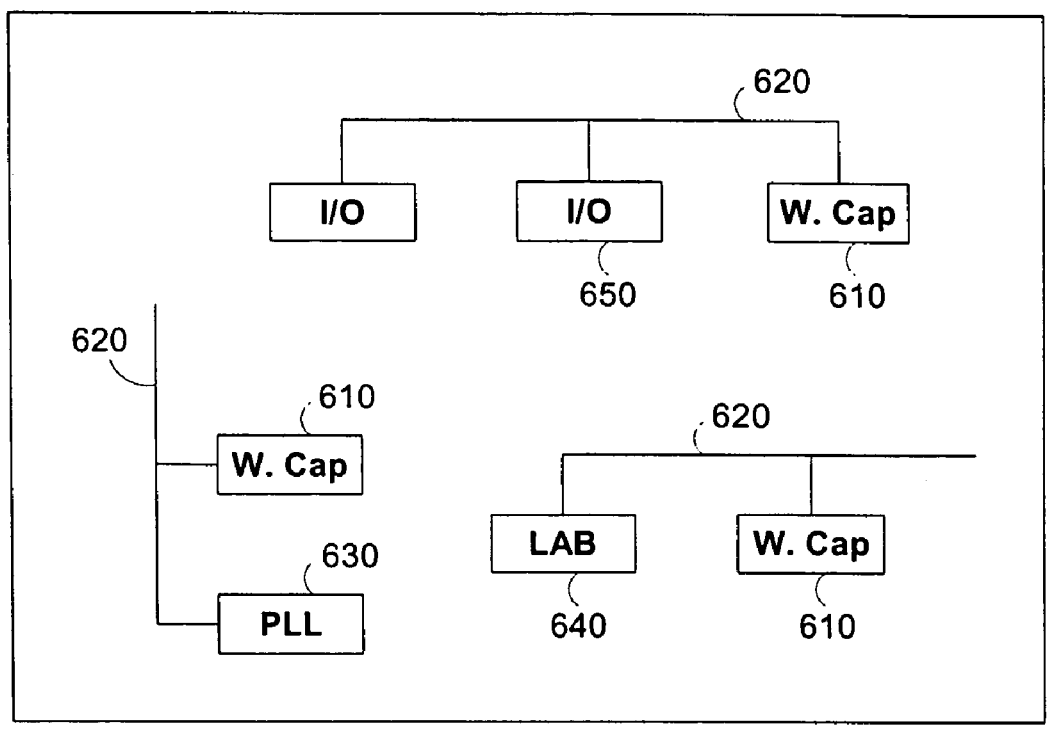
FIG. 6 is a simplified block diagram of an illustrative system employing a programmable logic device having on-chip decoupling capacitors in accordance with the present invention.

FIG. 6 shows programmable logic device 600 utilizing any of the decoupling capacitor schemes of the present invention described above. Decoupling capacitors 610 are shown in a number of implementations. In this particular FIGURE, capacitors 610 are shown coupled to multiple supply buses 620. Supply bus 620 may be coupled to a phase-lock loop circuit (PLL) 630, a logic array block (LAB) 640, an Input/Output (I/O) circuit 650, or any other suitable circuitry.

System 600 can be used in a wide variety of applications, such as computer networking, data networking, instrumentation, video processing, digital signal processing, or any other application where the advantage of using programmable logic is desirable. It should be noted that device 600 is only exemplary, and that the true scope and spirit of the invention should be indicated only by the following claims.

Thus, it is seen that improved decoupling capacitor designs and layout schemes are provided for generating high effective capacitance and high area efficiency at higher frequencies than that of previously known decoupling capacitor designs. One skilled in the art will appreciate that the present invention can be practiced by other than the described embodiments, which are presented for purposes of illustration and not of limitation, and the present invention is limited only by the claims which follow.

What is claimed is:

1. A programmable logic device formed on a silicon semiconductor substrate, the programmable logic device comprising a decoupling capacitor, said capacitor comprising:
    a diffusion layer diffused into the silicon semiconductor substrate, the diffusion layer comprising a first plurality electrical contacts forming a first capacitive node of the decoupling capacitor;
    a polysilicon layer formed over at least a portion of the diffusion layer, the polysilicon layer comprising holes and a second plurality of electrical contacts forming a second capacitive node of the decoupling capacitor; and
    wherein at least a portion of the first plurality of electrical contacts are formed under the holes such that an electrical conductor can pass through the holes to contact the first plurality of electrical contacts to form the decoupling capacitor.

2. The programmable logic device of claim 1, the polysilicon layer further comprising contacts formed over a portion of the diffusion layer.

3. The programmable logic device of claim 1, the polysilicon layer further comprising contacts formed over a portion of the silicon semiconductor substrate.

4. The programmable logic device of claim 1, further comprising an electrical insulator that insulates the electrical conductor from the polysilicon layer.

5. The programmable logic device of claim 1, wherein the polysilicon layer is formed from a plurality of interlocking fingers.

6. A digital processing system comprising:
    processing circuitry;
    a memory coupled to the processing circuitry; and
    a programmable logic device as defined in claim 1 coupled to the processing circuitry and the memory.

7. A printed circuit board on which is mounted a programmable logic device as defined in claim 1.

8. The printed circuit board defined in claim 7 further comprising:
    a memory mounted on the printed circuit board and coupled to the programmable logic device.

9. The printed circuit board defined in claim 8 further comprising:
    processing circuitry mounted on the printed circuit board and coupled to the programmable logic device.

10. A method of providing decoupling capacitance for use in a programmable logic device, the method comprising:
    forming a diffusion layer on a semiconductor substrate comprising a first plurality electrical contacts forming a first capacitive node of the decoupling capacitance;
    forming a polysilicon layer over at least a portion of the semiconductor substrate;
    forming a second plurality of electrical contacts in the polysilicon layer forming a second capacitive node of the decoupling capacitance; and
    forming holes in the polysilicon layer such that an electrical conductor can pass through the holes to contact the first plurality of electrical contacts to form the decoupling capacitance.

11. The method of claim 10, further comprising forming contacts in the polysilicon layer over a portion of the diffusion layer.

12. The method of claim 10, further comprising forming contacts in the polysilicon layer over a portion of the silicon semiconductor substrate.

13. The method of claim 10, further comprising insulating the electrical conductors from the polysilicon layer.

14. The method of claim 10, further comprising passing an electrical conductor through the holes to contact the electrical contacts.

15. The method of claim 10, further comprising forming said polysilicon layer from a plurality of interlocking polysilicon fingers.

* * * * *